United States Patent
Kobayashi et al.

(10) Patent No.: US 7,238,454 B2
(45) Date of Patent: Jul. 3, 2007

(54) METHOD AND APPARATUS FOR PRODUCING A PHOTOMASK BLANK, AND APPARATUS FOR REMOVING AN UNNECESSARY PORTION OF A FILM

(75) Inventors: Hideo Kobayashi, Tokyo (JP); Keishi Asakawa, Tokyo (JP)

(73) Assignee: Hoya Corporation, Tokyo (JP)

( * ) Notice: Subject to any disclaimer, the term of this patent is extended or adjusted under 35 U.S.C. 154(b) by 339 days.

(21) Appl. No.: 10/401,563

(22) Filed: Mar. 31, 2003

(65) Prior Publication Data
US 2003/0190534 A1   Oct. 9, 2003

(30) Foreign Application Priority Data
Mar. 29, 2002   (JP)   ............................. 2002-097767

(51) Int. Cl.
*G03F 1/00*   (2006.01)
(52) U.S. Cl. ..................... 430/5; 430/329; 430/330
(58) Field of Classification Search .................. 430/5, 430/329, 330
See application file for complete search history.

(56) References Cited

U.S. PATENT DOCUMENTS 5,869,211 A * 2/1999 Koshiishi ..................... 430/5
6,485,869 B2 * 11/2002 Tsai et al. ..................... 430/5
2003/0180633 A1 * 9/2003 Sato et al. ..................... 430/5

FOREIGN PATENT DOCUMENTS

| JP | 57-13863 | 3/1982 |
| JP | 63-160332 | 7/1988 |
| JP | 2001-259502 | 9/2001 |

* cited by examiner

*Primary Examiner*—Geraldina Visconti
(74) *Attorney, Agent, or Firm*—Sughrue Mion, PLLC

(57) ABSTRACT

In a method of producing a photomask blank, comprising a thin film forming step of forming, on a rectangular substrate, a thin film for causing an optical change in exposure light, a resist application step of applying a positive resist on the thin film, a baking step of heat treating the resist applied on the thin film, and a removing step of removing a resist film formed in a portion of the edge of the substrate, the removing step is carried out by exposing the resist film in the portion of the edge of the substrate after the resist application step and before the heat treating step so that, upon development subsequently carried out in the removing step, a difference in solubility or dissolving speed in a developer is obtained between an exposed area and an unexposed area and by selectively supplying the developer to the exposed area.

20 Claims, 8 Drawing Sheets

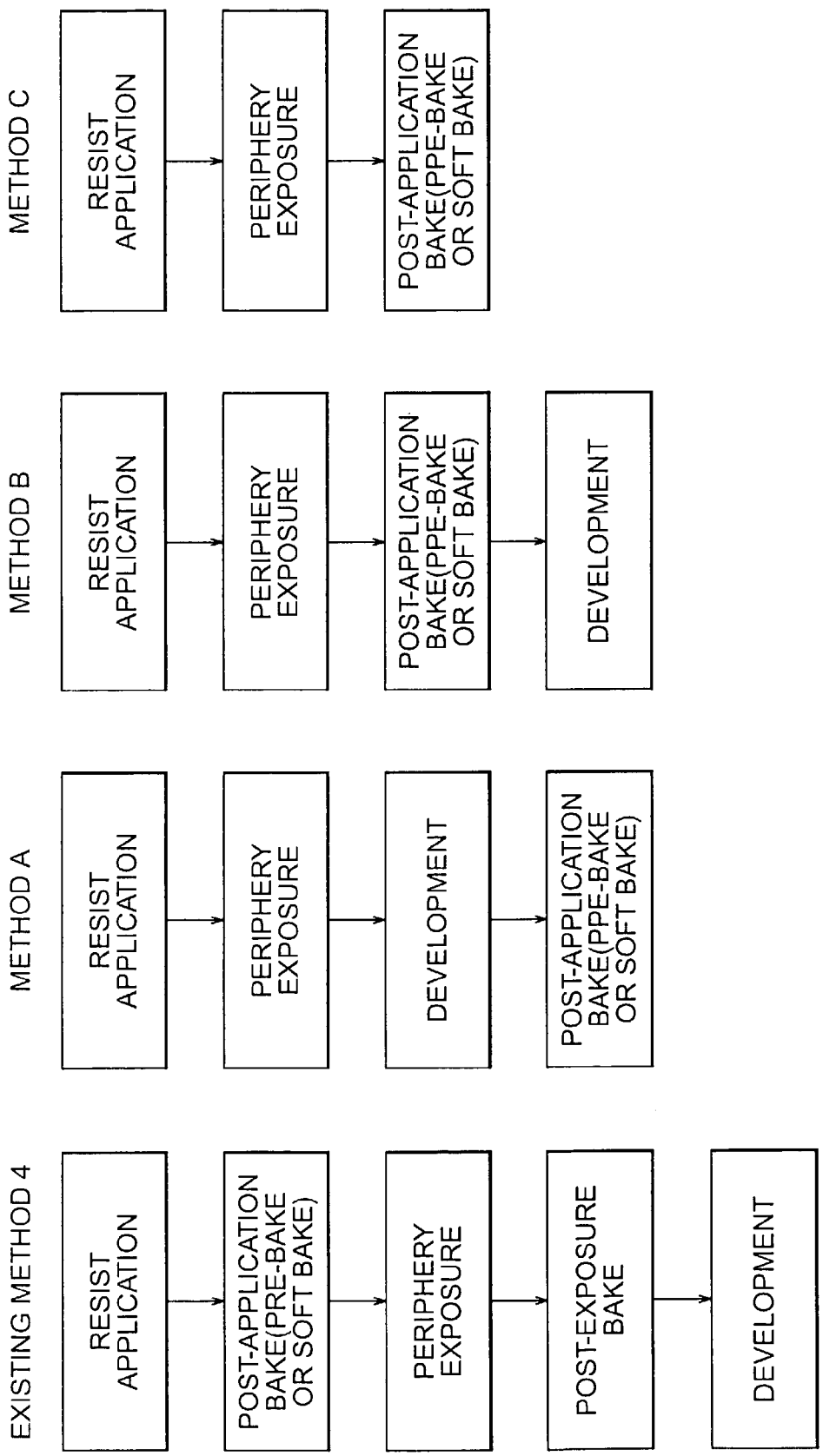

METHOD AND APPARATUS FOR PRODUCING A PHOTOMASK BLANK, AND APPARATUS FOR REMOVING AN UNNECESSARY PORTION OF A FILM

BACKGROUND OF THE INVENTION

This invention relates to a method and an apparatus for producing a photomask blank (hereinafter may simply be referred to as a mask blank) used to obtain a photomask (including a reticle) and including a transparent substrate on which a phase shift film, an opaque film, or a stack of the phase shift film and the opaque film is formed, and a resist applied thereon. This invention particularly relates to a method and an apparatus for producing a photomask blank from which an unnecessary film, i.e., an unnecessary part of a resist film is removed, which is formed in a peripheral portion or a portion of the edge of a substrate as a result of resist application. This invention also relates to an apparatus for removing the unnecessary portion of a film.

In the lithography technology as a method of producing a semiconductor device (such as LSI), a photomask (including a reticle) is used for transfer of circuit patterns. In order to produce the mask, a blank is used as a material. Referring to FIG. 1, the blank depicted at 5 in the figure is obtained in the following manner. On a transparent substrate 1 made of synthetic quartz or the like, an opaque film 2 made of chromium as a main component is formed on the transparent substrate 1. Then, an antireflection film 3 made of chromium oxide as a main component is continuously or discontinuously formed on the opaque film 2 by sputtering or the like. Thereafter, a resist is applied onto the antireflection film 3 by spin coating or the like, followed by heat treatment (post-application bake (pre-bake or soft bake)) for drying up to thereby form a resist film 4.

When the resist is applied as mentioned above, a relatively thick resist part 6 is formed in a portion of the edge of a substrate (i.e., a zone along four sides of a principal surface of the substrate 1 and an end face (side surface) of the substrate 1), as shown in FIG. 2 which is an enlarged view of an encircled part A in FIG. 1.

When the blank 5 is put into or taken out from a container, the resist part 6 in the portion of the edge of the substrate 1 is easily flaking (peeled off and released) as a result of contact and friction with the container and re-attached as a dust to the mask blank 5 itself or various apparatuses in a mask making process. This results in occurrence of a defect in the mask (including the reticle), which is a product obtained from the blank as a material, or in reduction of a production yield of the mask.

In order to solve the above-mentioned problem, it is required to remove an unnecessary part of the resist, i.e., an unnecessary resist film, which is formed in the portion of the edge of the substrate. As a technique of removing the unnecessary resist film, a method has been widely in use, which comprises the steps of selectively dissolving and removing the unnecessary resist film by the use of an organic solvent or the like after the resist is applied or after the post-application bake is carried out (for example, see Japanese Examined Patent Publication No. S57-13863 (JP-B)). The above-mentioned method will hereinafter referred to as a first existing method.

In the first existing method mentioned above, the unnecessary resist film formed in the portion of the edge of the substrate (a substrate end face 7, a chamfered face 8, a principal surface edge 9, and a resist removal area (a naked area of the opaque film) 10 on a principal surface) is removed, as illustrated in FIG. 3. However, a removal end (endmost portion) 11 left at a boundary between a resist film 12 and the resist removal area 10 has a remarkable edge roughness (irregularity or unevenness). In addition, as shown in FIG. 3A which is a sectional view taken along a line X1-X2 in FIG. 3, a remarkable protrusion 13 is formed at the removal end 11. Thus, the quality of resist removal is inferior.

In order to avoid the disadvantage in the first existing method using the organic solvent, another technique has widely been in use, which is for removing the unnecessary resist film formed in the portion of the edge of the substrate (although this technique is exclusively applicable to a positive resist). In case of a silicon wafer, the resist is applied to the wafer and the post-application bake is carried out. Thereafter, the unnecessary resist film formed in the portion of the edge of the substrate is selectively exposed by the use of a light source for emitting light having a wavelength within a range to which the resist is sensitive (generally, in an ultraviolet (UV) range or a deep-ultraviolet (DUV) range). Then, a main pattern is exposed. In a developing step subsequently carried out, formation of the main pattern and development/removal of the unnecessary resist film are simultaneously carried out. This technique will hereinafter be referred to as a second existing method.

The unnecessary resist film in the portion of the edge of the substrate is selectively exposed as an exposed part after the resist is applied and the post-application bake is carried out. Alternatively, the exposed part is selectively developed and removed immediately after the exposure prior to the main pattern exposure and development. For example, such periphery exposure technique is disclosed in Japanese Unexamined Patent Publication No. S63-160332. This technique will hereinafter be referred to as a third existing method.

In particular, in a production process of the blank and in a production process of the mask, the removal of the unnecessary resist film in the portion of the edge of the substrate must be completed at a stage when the blank is finished (i.e., at a stage when the application of the resist and the post-application bake are finished). Specifically, before the blank is inserted and packed into a storage container for the purpose of shipment and storage, the unnecessary resist film in the portion of the edge of the substrate must preliminarily be removed. Thereafter, the blank in the storage container is sent to the mask making process.

By the use of the periphery exposure technique in the third existing method mentioned above, it is possible to produce the blank that has the unnecessary resist film removed before being sent to the mask making process. Specifically, in the production process of the blank, the unnecessary resist film in the portion of the edge of the substrate is selectively exposed as an exposed part after the resist is applied and the post-application bake is carried out. Then, the exposed part is selectively developed and removed.

However, the periphery exposure technique in the third existing method is disadvantageous in the following respects because the periphery exposure is carried out after the resist is applied and the post-application bake is carried out.

At first, in case of a chemically-amplified (CA) resist recently and widely spread, after the resist is applied and the post-application bake is carried out, the blank is subjected to post-exposure bake (PEB) after exposure. Then, the exposed part begins to exhibit a sufficient solubility in a developer chemistry. Therefore, it is required to include the step of selectively exposing the unnecessary resist film, the step of performing the post-exposure bake (PEB), and the step of developing and removing the unnecessary resist film particularly in order to remove an unnecessary chemically-amplified resist film in the portion of the blank substrate edge by the use of selective exposure after resist is applied and post-application bake is carried out. In addition, apparatuses or mechanisms for carrying out these steps are required also. This results in an increase in scale of the process and the apparatus arrangement involved in resist application and in an increase in cost. Hereinafter, the above-mentioned technique will be referred to as a fourth existing method.

Second, in order to remove the unnecessary chemically-amplified resist film in the portion of the edge of the substrate by the use of selective exposure, the step of selectively exposing the unnecessary resist film must be followed by the post-exposure bake (PEB), as described above. However, it is practically impossible to carry out the post-exposure bake (PEB) selectively and exclusively upon the unnecessary portion of the resist film. As far as a typical baking apparatus (for example, a hot plate) is used, a patterning area of the principal surface of the substrate where the main pattern will later be formed is inevitably baked. Specifically, as compared with a blank obtained without removing the unnecessary portion of the resist film, another or one more excess baking step is additionally carried out. As a consequence, the sensitivity of the resist film in the patterning area of the principal surface of the substrate and the quality (for example, contrast) of the pattern to be formed are inevitably varied and deteriorated.

In the meanwhile, an electron beam (EB) lithography/exposure resist is mainly used in production of a high-accuracy mask. The chemically-amplified resist for EB lithography/exposure is generally sensitive to a light of the deep UV (ultraviolet) range. Therefore, it is possible to selectively expose, develop, and remove the unnecessary portion of the chemically-amplified resist film selectively by the use of a light source in the deep UV (ultraviolet) range in accordance with the fourth existing method described above.

On the other hand, in a high-molecular weight polymer-type EB lithography/exposure resist having little sensitivity to the deep UV (ultraviolet) range, it is not practical to expose the unnecessary portion of the resist film selectively by the use of an exposure light source in the deep UV (ultraviolet) range. For example, a high-molecular weight polymer-type resist made of a copolymer of alpha methyl styrene and alpha chloroacrylate is applied and subjected to post-application bake, and followed by periphery exposure by the use of a deep UV (ultraviolet) lamp under an exposure condition practical and particular for the chemically-amplified resist. In this event, there arises a third problem that the resist is not dissolved at all in a developer (organic solvent) chemistry.

In view of the above-mentioned background, this invention is made. This invention has following structures.

Structure 1

A method of producing a photomask blank, comprising a thin film forming step of forming, on a rectangular (including square) substrate, a thin film for causing an optical change in exposure light, a resist application step of applying a positive resist on the thin film, a baking step of heat treating the resist applied on the thin film, and a removing step of removing a resist film formed in a portion of an edge of the substrate, wherein the removing step is carried out by exposing the resist film in the portion of the edge of the substrate after the resist application step and before the baking step so that, upon development subsequently carried out in the removing step, a difference in solubility or dissolving speed in a developer is obtained between an exposed area and an unexposed area and by selectively supplying the developer to the exposed area.

Structure 2

A method of producing a photomask blank as described in structure 1, wherein the removing step by the development is carried out before or after the baking step.

Structure 3

A method of producing a photomask blank as described in structure 1 or 2, wherein the photomask blank is covered at least in its peripheral portion by a cover member with a predetermined distance left between a principal surface of the photomask blank and the cover member, the predetermined distance being selected so that the developer is filled exclusively in a gap defined by the predetermined distance for capillary action (phenomenon) when the developer is supplied to the gap, the developer being supplied to the gap defining a developer supply area on the principal surface of the photomask blank so that the resist film formed in the portion of the edge of the substrate is removed.

Structure 4

A method of producing a photomask blank, comprising a thin film forming step of forming, on a rectangular (including square) substrate, a thin film for causing an optical change in exposure light, a resist application step of applying a positive resist on the thin film, and a baking step of heat treating the resist applied on the thin film, wherein the resist film in the portion of the edge of the substrate is exposed after the resist application step and before the baking step so that, in a developing step during a photomask production process, the resist film in the portion of the edge of the substrate exposed as mentioned above is removed simultaneously with formation of a mask pattern.

Structure 5

A method of producing a photomask blank as described in any one of structures 1 through 4, wherein the resist application step comprises a leveling (uniforming) step of dispensing an amount of a resist solution onto the rectangular substrate and rotating the substrate at a predetermined principal rotation speed for a predetermined principal rotation time mainly to achieve a uniform thickness of the resist, and a drying step of rotating, after the leveling step, the substrate at a predetermined dry rotation speed lower than the principal rotation speed for a predetermined dry rotation time mainly to dry the resist having the uniform thickness.

Structure 6

A method of producing a photomask blank as described in any one of structures 1 through 5, wherein the resist is a chemically-amplified resist.

Structure 7

An unnecessary film removing apparatus for removing, from a positive resist film formed on a surface of a photomask blank, an unnecessary part formed in a portion of an edge of the substrate as an unnecessary film, the apparatus comprising:

exposure means for exposing the unnecessary part of the positive resist film formed in the portion of the edge of the substrate;

baking means for heat treating the positive resist film; and removing means for selectively supplying a developer to a resist-removing region of the substrate where the positive resist film is to be removed, and removing the unnecessary film by development.

Structure 8

An unnecessary film removing apparatus as described in structure 7, wherein the removing means comprises holding means for holding the photomask blank horizontally so that the photomask blank is rotatable around a vertical axis, a cover member at least covering the portion of the edge of the photomask blank and provided with a distance adjusting member for adjusting a distance between a principal surface of the photomask blank and the cover member so that a developer is filled exclusively in a gap defined by the distance when the developer is supplied to the gap, and developer supply means for supplying the developer to the gap.

Structure 9

An unnecessary film removing apparatus as described in structure 7 or 8, wherein the exposure means comprises holding means for holding the photomask blank horizontally so that the photomask blank is scanning linearly along an axis, exposure means for irradiating the portion of the edge of the photomask blank with light, and driving means for driving one or both of the exposure means and the holding means so that the exposure means carries out scanning along the portion of the edge of the photomask blank.

Structure 10

An unnecessary film removing apparatus as described in structure 9, wherein the driving means comprises scanning speed adjusting means for changing a scanning speed so that an accumulated or integrated exposure energy of light emitted by the exposure means is changed in dependence upon various thickness of the unnecessary film formed in the portion of the edge of the photomask blank.

Structure 11

An unnecessary film removing apparatus as described in any one of structures 7 through 10, wherein the resist is a chemically-amplified resist.

Structure 12

A photomask blank producing apparatus comprising a resist application apparatus for applying a positive resist on a surface of a photomask blank including a rectangular substrate and a thin film formed on the substrate for causing an optical change in exposure light, and an unnecessary film removing apparatus described in any one of structures 7 through 11, the unnecessary film removing apparatus being arranged so that the exposure means, the removing means, and the baking means are disposed in this order along a conveying line of the photomask blank.

Structure 13

A photomask blank producing apparatus comprising a resist application apparatus for applying a positive resist on a surface of a photomask blank including a rectangular substrate and a thin film formed on the substrate for causing an optical change in exposure light, and an unnecessary film removing apparatus described in any one of structures 7 through 11, the unnecessary film removing apparatus being arranged so that the exposure means, the baking means, and the removing means are disposed in this order from an upstream side towards a downstream side along a conveying line of the photomask blank.

BRIEF DESCRIPTION OF THE DRAWINGS

FIG. 4 is a flow chart for describing a photomask blank producing method according to an existing method;

FIGS. 5A through 5C are flow charts for describing photomask blank producing methods according to this invention;

DESCRIPTION OF THE PREFERRED EMBODIMENTS

Figure 1:
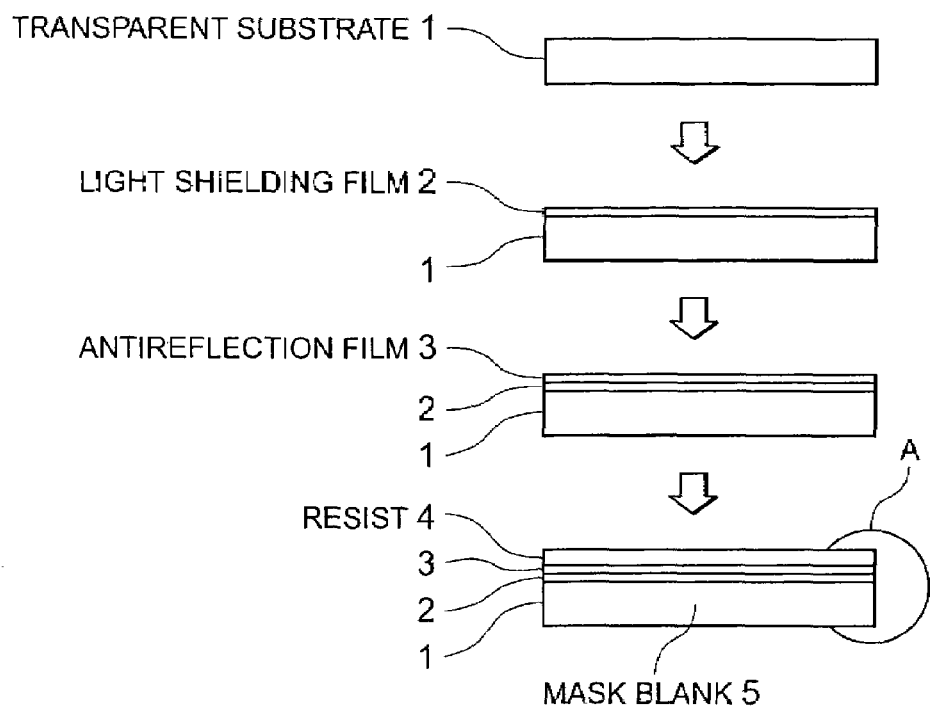
FIG. 1 is a view for describing a typical process of producing a blank.
Figure 2:
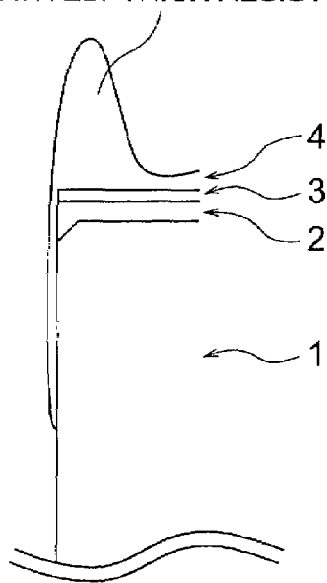
FIG. 2 is an enlarged view of an encircled part in FIG. 1.
Figure 3:
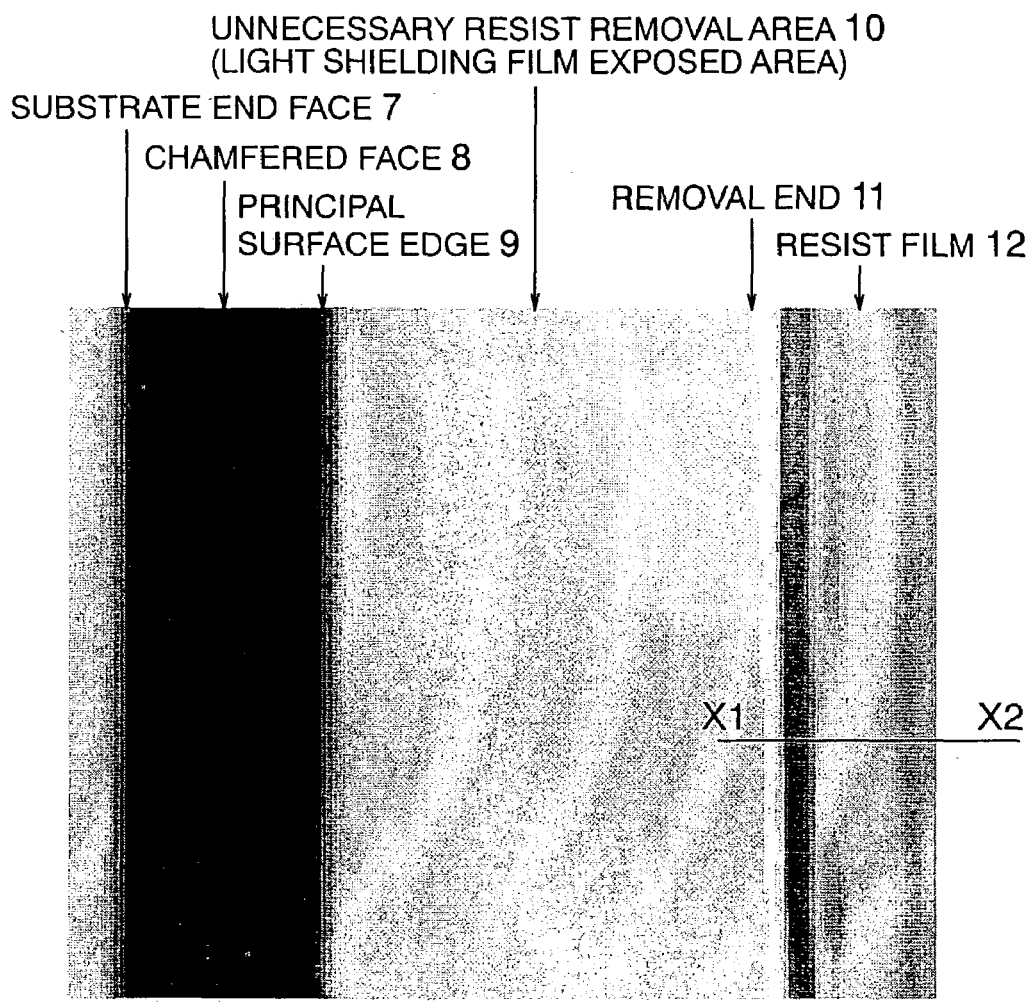
FIG. 3 is a view showing a surface of a substrate from which an unnecessary resist film is removed by an organic solvent.
Figure 3A:
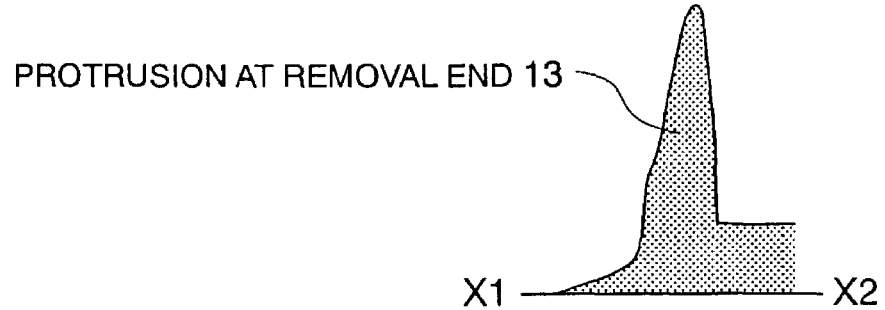
FIG. 3A is a sectional view taken along a line X1-X2 in FIG. 3.

Now, this invention will be described in detail.

From the study of the present inventors, it has been found out that, simply by introducing post-application exposure, selective solubility (solubility difference or difference in dissolving speed) between an exposed area and an unexposed area is assured in a developing/removing step even in case of a positive chemically-amplified (CA) resist. The post-application exposure is an operation of selectively exposing an unnecessary resist film after the resist is applied and before post-application bake (prebake or soft bake) is carried out. Specifically, even if post-exposure bake (PEB), which is presently believed essential for the chemically-amplified resist, is not carried out, it is possible to remove the unnecessary resist film by development. Thus, it has been found out that a step or a mechanism for carrying out the post-exposure bake independent of the post-application bake is no longer necessary.

In case of the chemically-amplified resist, this invention is advantageous in the following respect. As illustrated in FIG. 4, the above-mentioned fourth existing method of removing an unnecessary resist in a portion of the edge of a substrate by the use of a typical process of treating the chemically-amplified resist requires a resist application step or mechanism, a post-application bake step or mechanism, an exposure step or mechanism for selectively exposing the unnecessary resist film in the portion of the edge of the substrate (periphery exposure), a post-exposure bake (PEB) step or mechanism, and a developing/removing step or mechanism. On the other hand, this invention does not require the post-exposure bake step or mechanism. It is therefore possible to achieve simplification in process steps and apparatus arrangement and to reduce the production cost, as compared with the fourth existing method.

Consideration will be made about a polymer-type EB lithography/exposure resist which has little sensitivity to the deep UV (ultraviolet) range. Even in case of the polymer-type EB lithography/exposure resist, the unnecessary resist film in the portion of the edge of the substrate can practically be removed by selectively exposing the unnecessary resist film to deep UV (ultraviolet) radiation after the resist is applied and before the post-application bake (pre-bake or soft bake) is carried out. In case where the unnecessary resist film is selectively exposed to the deep UV (ultraviolet) radiation after the post-application bake, it is difficult to practically remove the unnecessary resist film in the portion of the edge of the substrate of the polymer-type EB lithography/exposure resist, as already described as the third problem.

It has also been found out that, by selectively exposing the unnecessary resist film after the resist (of any type) is applied and before the post-application bake (pre-bake or soft bake) is carried out, the exposure can be carried out with less exposure energy, as compared with the exposure after the post-application bake is carried out.

As compared with the first existing method of selectively dissolving and removing the unnecessary resist film in the portion of the edge of the substrate by the use of an organic solvent, the method of producing a blank according to this invention is advantageous in the following respect. Specifically, since chemical reaction of exposure/development is used in this invention, no remarkable swelling is caused at an end portion of the resist which is not removed but left as a pattern. Therefore, no remarkable protrusion is formed at a removal end (edge). In addition, irregularity or unevenness at the removal end is small.

From the foregoing, a method of producing a blank according to Structure 1 of this invention is characterized in that a resist film in a portion of the edge of a substrate is exposed after a resist application step and before a baking step (post-application bake (pre-bake or soft bake) for drying an applied resist). By exposing the resist film in the portion of the edge of the substrate before the baking step, a difference in solubility or dissolving speed by a developer is assured between an exposed area and an unexposed area.

In Structure 1, the thin film for causing an optical change in exposure light is a phase shift film (including a multilayer film), an opaque film (including a multilayer film), or a stack of the phase shift film and the opaque film.

According to Structure 2, a removing step of removing the resist film in the portion the edge of the substrate by development can be carried out before or after the baking step. Specifically, after the resist is applied and before the post-application bake (pre-bake or soft bake) is carried out, the unnecessary resist film is selectively exposed and thereafter dissolved/removed by development/removal. Subsequently, the post-application bake is carried out. This method will hereinafter be referred to as an inventive method A (see FIG. 5A). The inventive method A is a method of producing a blank, comprising an exposing step and a developing step which are carried out between the resist application and the post-application bake (pre-bake or soft bake).

Alternatively, the unnecessary resist film is selectively exposed after the resist is applied and before the post-application bake (pre-bake or soft bake) is carried out. Thereafter, the post-application bake is carried out. Subsequently, the unnecessary resist film selectively exposed is dissolved and removed by development/removal. This method will hereinafter be referred to as an inventive method B (see FIG. 5B). The inventive method B is a method of producing a blank, comprising an exposing step between the resist application and the post-application bake (pre-bake or soft bake) and a developing step after the post-application bake (pre-bake or soft bake). In the inventive method B, the post-application bake also serves as post-exposure bake in the chemically-amplified resist.

Figure 6:
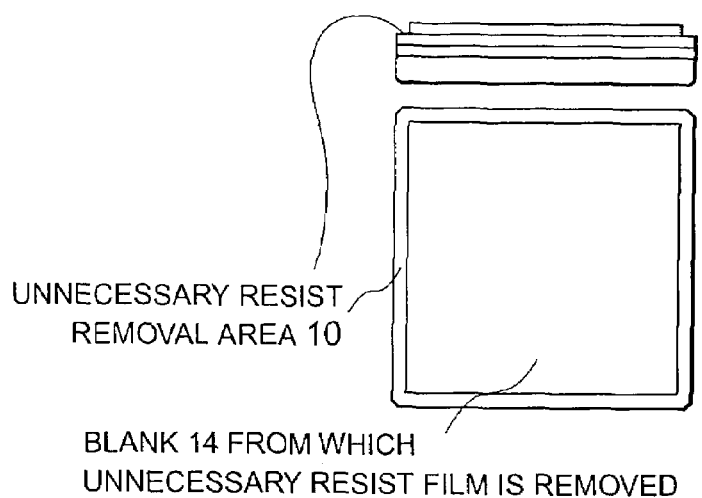
FIG. 6 is a view showing a photomask blank according to one embodiment of this invention corresponding to FIGS. 5A and 5B.

This invention includes a blank 14 (see FIG. 6) obtained by the above-mentioned inventive methods A and B from which the unnecessary resist film formed in the portion of the edge of the substrate is removed.

Figure 7:
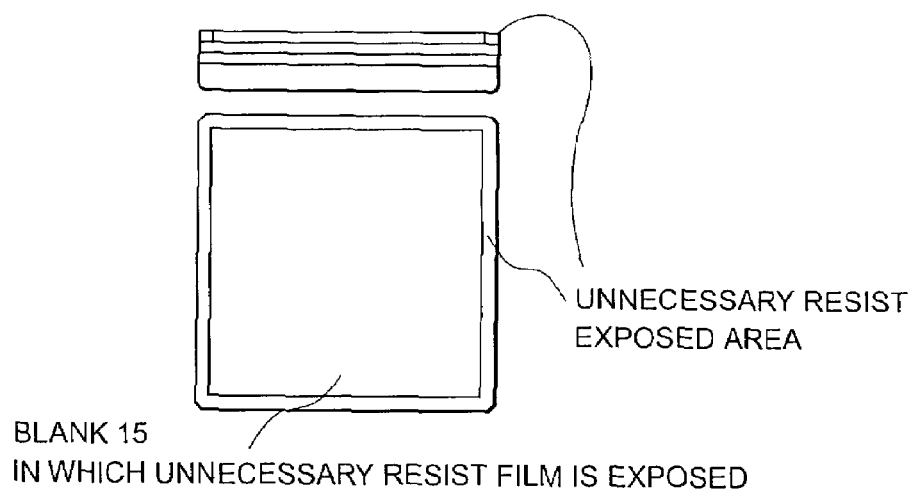
FIG. 7 is a view showing a photomask blank according to another embodiment of this invention corresponding to FIG. 5C.

This invention also includes a method of producing a blank (which will hereinafter be referred to as an inventive method C) in which the unnecessary resist film formed in the portion of the edge of the substrate is selectively exposed before the post-application bake (pre-bake or soft bake for drying the applied resist) is carried out and, thereafter, the post-application bake alone is carried out (see FIG. 5C). This invention further includes a blank 15 (see FIG. 7) obtained by the above-mentioned method C (Structure 4). The blank 15 has been sufficiently exposed at the stage of completion of the blank so that the unnecessary resist film is removed in the developing step subsequently carried out to develop the main pattern. It is therefore possible to prevent the unnecessary resist film from being peeled off and released as a result of contact between the blank and a container or a jig when the blank is put in or taken out from the container or the jig for the purpose of shipment or storage after the developing step in a subsequent mask production process.

In order to selectively supply a developer to an exposed area to be selectively exposed, use is preferably made of the technique described in Structure 3. Specifically, the photomask blank is covered at least in its peripheral portion by a cover member with a predetermined distance left between a principal surface of the photomask blank and the cover member. The predetermined distance is selected so that the developer is filled exclusively in a gap defined by the predetermined distance for capillary action (phenomenon) when the developer is supplied to the gap. By supplying the developer to the gap, the resist film formed in the peripheral portion of the substrate is removed. In the above-mentioned manner, a developer supply area can precisely be controlled.

In Structure 5, the resist application step comprises a leveling step of dispensing an amount of a resist solution onto the rectangular substrate and rotating the substrate at a predetermined principal rotation speed for a predetermined principal rotation time mainly to achieve a uniform thickness of the resist, and a drying step of rotating, after the leveling step, the substrate at a predetermined dry rotation speed lower than the principal rotation speed for a predetermined dry rotation time mainly to dry the resist having the uniform thickness.

With the above-mentioned structure, a resist film excellent in in-plane uniformity is formed in a mask patterning area, even in case of the rectangular substrate. In addition, a very thick area (thick film area) can be restricted to a minimized peripheral area. Therefore, if the unnecessary film in the portion of the edge of the substrate is removed by a method of removing an unnecessary film according to this invention, it is possible to obtain a blank having no substantial thick film area or having a very little thick film area.

It is noted here that the principal rotation speed, the principal rotation time, the dry rotation speed, and the dry rotation time are appropriately selected within the following ranges, depending upon the type and the viscosity of the resist.

| | |
|---|---|
| Principal Rotation Speed: | 750-2000 rpm |
| Principal Rotation Time: | 1–30 sec |
| Dry Rotation Speed: | 50–450 rpm |
| Dry Rotation Time: | 10 sec or more (until the resist film is dried) |

In Structure 6, the chemically-amplified resist is used as the resist. In this event, one step of the post-application bake (pre-bake or soft bake) can be omitted.

Next, description will be made of an unnecessary film removing apparatus and a blank producing apparatus according to this invention.

The unnecessary film removing apparatus according to this invention is an apparatus for removing, from a positive resist film formed on a surface of a photomask blank, an unnecessary part formed in a portion of the edge of the substrate as an unnecessary film and comprises exposure means for exposing the unnecessary part of the positive resist film formed in the portion of the edge of the substrate, baking means for heat treating the positive resist film, and removing means for selectively supplying a developer to a resist-removing region of the substrate where the positive resist film is to be removed, and removing the unnecessary film by development (Structure 7).

In the unnecessary film removing apparatus according to this invention, the removing means preferably comprises holding means for holding a photomask blank horizontally so that the photomask blank is rotatable around a vertical axis, a cover member at least covering the portion of the edge of the photomask blank and provided with a distance adjusting member for adjusting a distance between a principal surface of the photomask blank and the cover member so that a developer is filled exclusively in a gap defined by the distance when the developer is supplied to the gap, and developer supply means for supplying the developer to the gap (Structure 8).

Figure 13:
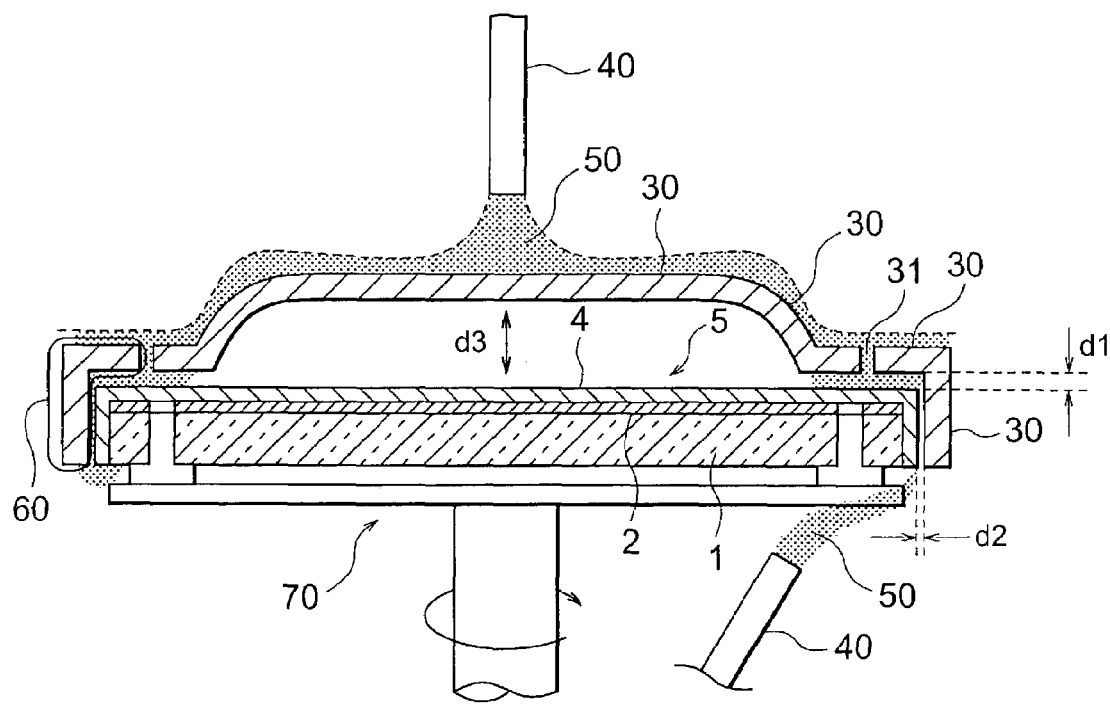
FIG. 13 is a view showing unnecessary film removing means in the apparatus of this invention.

Referring to FIG. 13, an unnecessary film removing apparatus is generally similar to that disclosed in Japanese Unexamined Patent Publication No. 2001-259502. A substrate 5 with a resist film 4 formed thereon is placed on a rotary table 70. An upper surface of the substrate 5 is covered with a cover member 30. From a position above the cover member 30, a solvent 50 (such as a developer) is supplied from a nozzle 40. The solvent 50 is supplied through a solvent supply hole 31 formed at a predetermined position of the cover member 30 to an area of an unnecessary resist film to dissolve and remove the unnecessary resist film. The cover member 30 is provided with a distance adjusting member 60.

Figure 11:
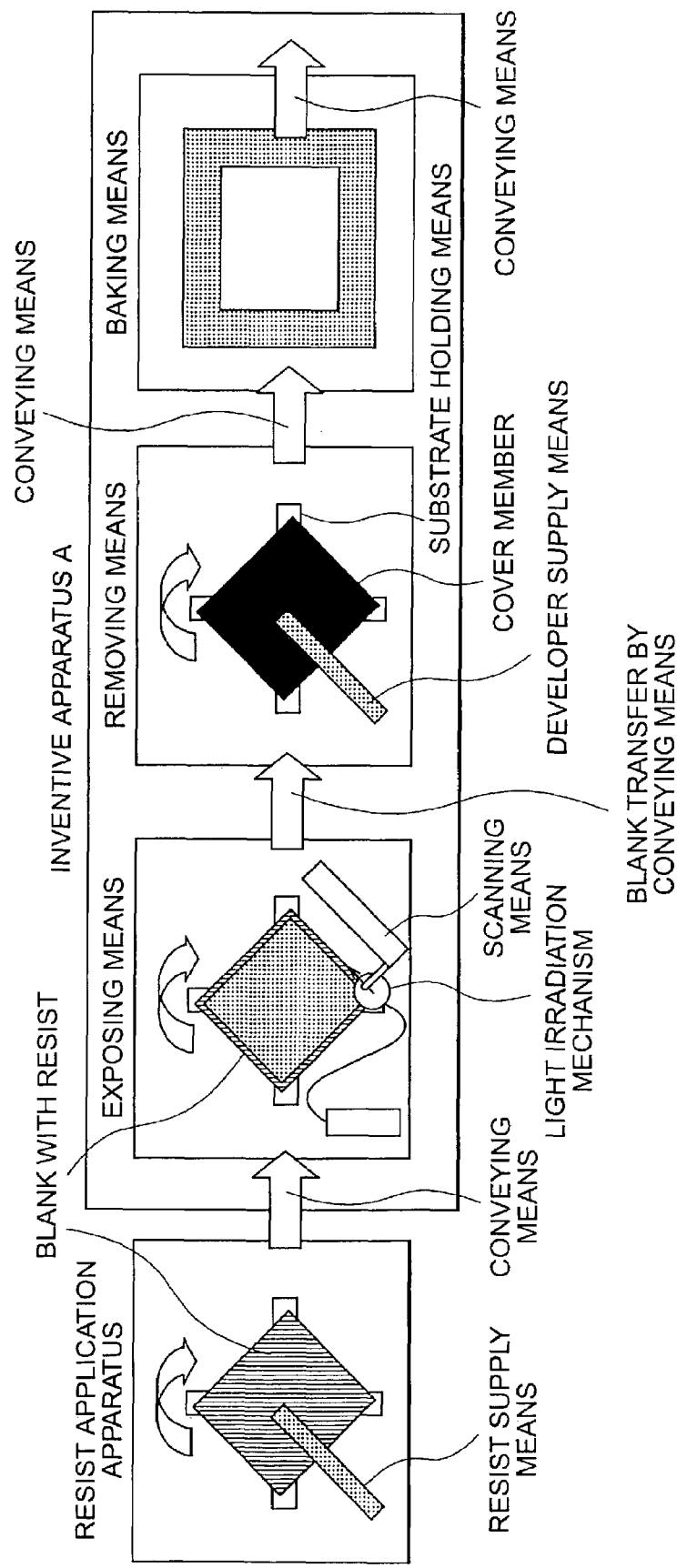
FIG. 11 is a view showing a photomask blank producing apparatus according to one embodiment of this invention.
Figure 12:
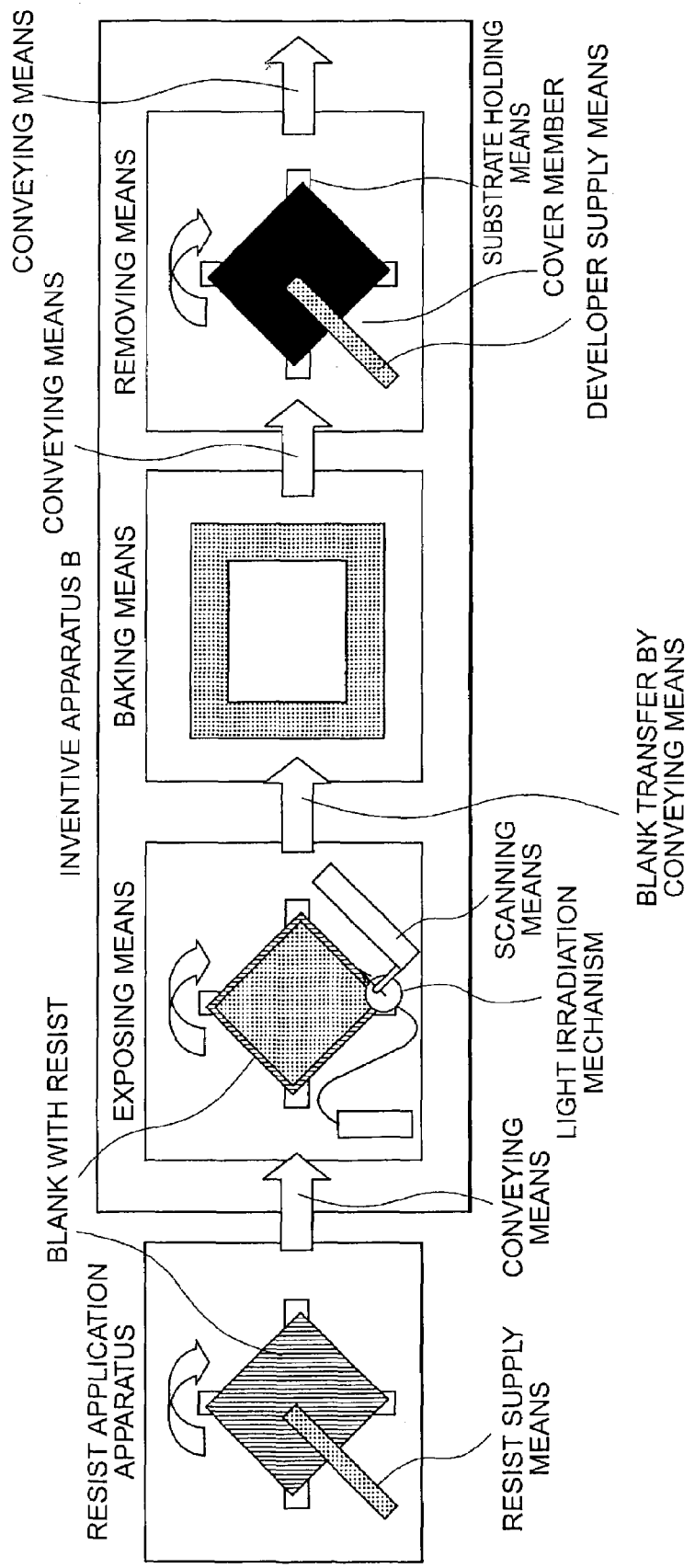
FIG. 12 is a view showing a photomask blank producing apparatus according to another embodiment of this invention.

In the unnecessary film removing apparatus according to this invention, the exposure means preferably comprises holding means for horizontally holding the photomask blank so that the photomask blank is scanning linearly along an axis, exposure means for irradiating the portion of the edge of the photomask blank with light, and scanning means for making the exposure means perform scanning along the portion of the edge of the photomask blank., as shown in FIGS. 11 and 12 (Structure 9). By driving means for driving one or both of the exposure means (exposure window) and the holding means so that the exposure means carries out scanning along the portion of the edge of the photomask blank, it is possible to perform partial exposure of the portion of the edge of the substrate.

In the unnecessary film removing apparatus, the driving means preferably comprises scanning speed adjusting means for changing a scanning speed so that an accumulated or integrated exposure energy of light emitted by the exposure means is changed in dependence upon various thickness of the unnecessary film formed in the portion of the edge of the photomask blank. (Structure 10). In case of the rectangular substrate, the resist formed by spin coating is increased in thickness at four corners of the substrate in most cases. In case where scanning is carried out at a constant irradiation energy of light for the portion of the edge of the photomask blank, the selective solubility (difference in solubility or dissolving rate) between an exposed area and an unexposed area can not be obtained and, consequently, a resist residue may be produced. In this event, it is necessary to increase the accumulated luminous energy of light emitted by the exposure means to a relatively thick area. For this purpose, the exposure means is provided with the scanning speed adjusting means for changing the scanning speed so that the scanning speed of the exposure means is reduced in the relatively thick area so that the unnecessary film can reliably be removed without the resist residue. In case where formation of the relatively thick area is preliminarily expected by a resist application condition, it is unnecessary to measure the thickness of the portion of the edge of the photomask blank. However, the unnecessary film removing apparatus of this invention may be provided with film thickness measuring means for measuring the thickness of the resist film.

Figures 14A, 14B, 14C:
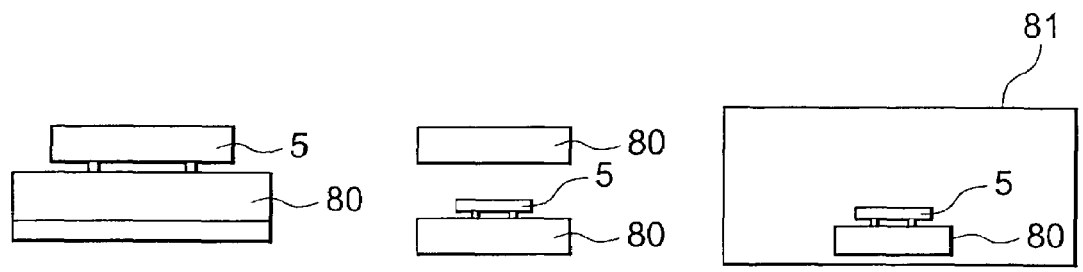
FIGS. 14A to 14C are views showing examples of baking means in the apparatus of this invention.

In the unnecessary film removing apparatus of this invention, the baking means may be a hot plate shown in FIG. 14A, a combination of upper and lower hot plates shown in FIG. 14B, or a closed-type baking unit shown in FIG. 14C. In these figures, the substrate with a resist, the hot plate, and a closed chamber are represented by 5, 80, and 81, respectively. Herein, the substrate 5 with a resist is not directly mounted on the hot plate 80 but is mounted with a predetermined proximity gap therefrom. The closed-type baking unit may be of the type in which the hot plate 80 as a heater is disposed below the substrate and all these are enclosed, as illustrated in FIG. 14C. Alternatively, the closed-type bake unit may be of the type in which the heater is disposed below the substrate and another heater or a reflection plate is disposed above the substrate and all these are enclosed.

A photomask blank producing apparatus according to this invention may comprise a resist application apparatus for applying a chemically-amplified resist on a surface of a photomask blank including a rectangular substrate and a thin film formed on the substrate for causing an optical change in exposure light, and the above-mentioned unnecessary film removing apparatus. As described in Structure 12, the unnecessary film removing apparatus is arranged so that the exposure means, the removing means, and the baking means are disposed in this order along a conveying line of the photomask blank. The photomask blank producing apparatus will hereinafter be referred to as an inventive apparatus A (FIGS. 5A and 11). The inventive apparatus A is a photomask blank producing apparatus comprising exposure means between resist application and post-application bake (pre-bake or soft bake) and a developing mechanism after the post-application bake (pre-bake or soft bake).

Another photomask blank production apparatus according to this invention may comprise a resist application apparatus for applying a chemically-amplified resist on a surface of a photomask blank including a rectangular substrate and a thin film formed on the substrate for causing an optical change in exposure light, and the above-mentioned unnecessary film removing apparatus. As described in Structure 13, the unnecessary film removing apparatus is arranged so that the exposure means, the baking means, and the removing means are disposed in this order from an upstream side towards a downstream side along a conveying line of the photomask blank. The photomask blank producing apparatus will hereinafter be referred to as an inventive apparatus B (FIGS. 5B and 12). The inventive apparatus B is a photomask blank producing apparatus comprising an exposing mechanism and a developing mechanism which are arranged between resist application and post-application bake (pre-bake or soft bake).

This invention also includes a photomask blank producing apparatus comprising exposure means between resist application and post-application bake (pre-bake or soft bake). The photomask blank producing apparatus will hereinafter be referred to as an inventive apparatus C (FIG. 5C).

In the blank which is produced by the above-mentioned method or the above-mentioned apparatus according to this invention and from which the unnecessary resist film formed in the portion of the edge of the substrate is removed, the removal of the unnecessary resist film is completed at a stage when the blank is finished (i.e., at a stage when the application of the resist and the post-application bake (pre-bake or soft bake) are finished). Thus, in this invention, the formation of the main pattern (development) and the development/removal of the unnecessary resist film are not simultaneously carried out, unlike the existing periphery exposure technique (second existing method). Therefore, it is possible to prevent the unnecessary resist film from being peeled off and released as a result of contact between the blank and a container when the blank is put in or taken out from the container for the purpose of shipment or storage. In the mask production process subsequently carried out, the resist film is prevented from being peeled off and released as a result of contact between the blank and the processing apparatus or the container.

In the blank which is produced by the above-mentioned method or the above-mentioned apparatus according to this invention and from which the unnecessary resist film formed in the portion of the edge of the substrate is removed, the unnecessary resist film in the portion of the edge of the blank is removed. Therefore, during EB lithography/exposure, it is possible to reliably establish ground connection of a chromium film of the blank. Therefore, it is possible to avoid an error in pattern position or deformation of the pattern due to charge-up during lithography. Generally, the ground connection is established by pressing a needle-like or knife-like grounding probe against the blank through the resist film. Accordingly, grounding resistance is large or ground connection is impossible at all.

In the blank which is produced by the above-mentioned method or the above-mentioned apparatus according to this invention and from which the unnecessary resist film formed in the portion of the edge of the substrate is removed, the unnecessary resist film in the portion of the edge of the blank is removed. In that part, the chromium film or the phase shift film is exposed. Therefore, these films exposed in that part are etched and removed in an etching step in the subsequent mask making process. Accordingly, in a subsequent step, such as a cleaning step, or in a step of using the mask (including the reticle), the chromium film or the phase shift film is prevented from being peeled off or released from the portion of the edge of the substrate. Thus, it is possible to prevent chromium fragments peeled off and released from being attached to the mask to cause a defect and from contaminating the environment.

EXAMPLES

Hereinafter, specific examples of this invention will be described.

Example 1

At first, an example according to the inventive method A and the inventive apparatus A was prepared. As illustrated in FIG. 1, a synthetic quartz substrate 1 having a size of 6 inch square (152.4 mm×152.4 mm) and a thickness of 0.25 inch (6.35 mm) and appropriately polished was prepared. On the substrate 1, an opaque film 2 made of chromium as a main component and an antireflection film 3 made of chromium oxide as a main component were successively formed by sputtering in this order. Then, a resist 4 (chemically-amplified EB lithography/exposure positive resist FEP (Fuji EB Positive resist) 171 manufactured by FUJIFILM ARCH) was applied by spin coating to a thickness of 400 nm under the following condition.

| Resist Concentration: | 6.2% (viscosity: 3cp (centipoises)) |
|---|---|
| Leveling Step (Uniforming Step) | |
| Principal Rotation Speed: | 1500 rpm |
| Principal Rotation Time: | 2 sec |
| Drying Step | |
| Dry Rotation Speed: | 300 rpm |
| Dry Rotation Time: | 20 sec |

Figure 8:
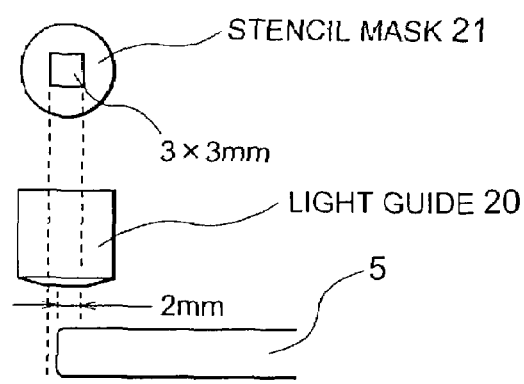
FIG. 8 is a view showing an exposure apparatus used in this invention.

Next, a mercury lamp (UL500L manufactured by HOYA-SCHOTT) comprising a light guide (10 mm φ) 20 comprising a quartz fiber with a condenser lens having a focal distance of 10 mm and attached at its end was used as an exposure light source. At a focal point position, a stencil mask 21 having a square opening of 3 mm×3 mm was attached. The exposure light source was placed so that about 2 mm of the stencil mask (exposure window) overlapped the substrate from its end towards the center and that the light guide was positioned at a space of 3 mm from the upper surface of the substrate (FIG. 8). Next, the exposure light source was turned on and, simultaneously, the exposure window was moved by scanning means at a speed of about 10 mm/sec along one side of the portion of the edge of the substrate. After completion of exposure for the one side (152.4 mm), the substrate was rotated by 90 degrees. Then, a next side was similarly exposed. In this manner, all of the four sides of the substrate were exposed. Thus, the unnecessary resist film in the portion of the edge of the substrate was exposed.

Subsequently, use was made of the apparatus (Structure 8), for example, disclosed in Japanese Unexamined Patent Publication No. 2001-259502. Adjustment was appropriately carried out so that a developer would selectively be supplied to the above-mentioned part selectively exposed. The substrate was rotated at 500 rpm and treated for 30 seconds by the use of a standard developer 2.38% TMAH (tetramethylammoniumhydroxide) (NMD-3 manufactured by TOKYO OHKA KOGYO) supplied at a flow rate of 100 cc/min. Immediately thereafter, ultra pure water was supplied instead of the developer to rinse that part subjected to development/removal. Then, the substrate was rotated at 2000 rpm to be subjected to rotary dry. Thus, the removal of the unnecessary resist film in the portion of the edge of the substrate was completed.

Finally, the substrate after the above-mentioned process was subjected to post-application bake for 10 minutes by the use of a hot plate (proximity gap: 0.2 mm) kept at 150° C. Thus, production of the blank was completed (Sample 1A).

Next, an example according to the inventive method B and the inventive apparatus B was prepared. At first, the FEP 171 was applied in the manner similar to the sample 1A mentioned above. Subsequently, by the use of the same exposure apparatus and the same method as those mentioned above, the portion of the edge of the substrate was exposed by moving the substrate at a speed of about 10 mm/sec. Thereafter, the substrate was subjected to post-exposure bake for 10 minutes by the use of a hot plate (proximity gap 0.2 mm) kept at 150° C. Finally, the exposed part was selectively developed and removed by the use of the apparatus disclosed in Japanese Unexamined Patent Publication No. 2001-259502. Thus, the removal of the unnecessary resist film in the portion of the edge of the substrate was completed and the blank was produced (Sample 1B).

Next, as a control for comparison, a sample was prepared by exposing, developing, and removing the unnecessary resist film in accordance with the typical process of treating the chemically-amplified resist (fourth existing method). Specifically, the FEP 171 was applied in the manner similar to the samples 1A and 1B. Thereafter, in the manner similar to the samples 1A and 1B, the substrate was subjected to post-application bake for 10 minutes by the use of a hot plate (proximity gap: 0.2 mm) kept at 150° C. Thereafter, the substrate was moved at a speed of about 7.5 mm/sec and the peripheral portion of the substrate was exposed. Then, the substrate was subjected to post-exposure bake for 10 minutes by the use of a hot plate (proximity gap: 0.2 mm) kept at 150° C. Finally, in the manner similar to the samples 1A and 1B, the exposed part was selectively developed and removed. Thus, removal of the unnecessary resist film in the portion of the edge of the substrate was completed and the photomask blank was produced (Sample 1C). Herein, the exposure amount in the periphery exposure was great (i.e., the substrate scanning speed is small) as compared with the sample 1A. This is because the unnecessary resist film was not removed (not dissolved at all or dissolved but the residue was left) at the scanning speed higher than about 7.5 mm/sec.

Similarly, as another control for comparison, a sample was prepared in accordance with the removing method using the organic solvent (first existing method). Specifically, in the manner similar to the samples 1A through 1C, the FEP 171 was applied. Thereafter, by the use of the apparatus disclosed in Japanese Unexamined Patent Publication No. 2001-259502, like in the foregoing samples, and acetone as the organic solvent, the unnecessary resist film in the portion of the edge of the substrate was dissolved and removed. Thereafter, in the manner similar to the samples 1A to 1C, the substrate was subjected to post-application bake for 10 minutes by the use of a hot plate (proximity gap: 0.2 mm) kept at 150° C. Thus, the blank was produced (Sample 1D).

In each of the samples 1A to 1D, the in-plane uniformity of the thickness of the resist film including the mask patterning area was as excellent as 50 angstroms or less. The in-plane uniformity of the thickness of the resist film was obtained in the following manner. At 11×11=121 points uniformly distributed throughout an effective area 132 mm×132 mm at the center of the substrate, the thickness was measured by the use of the spectral reflection thickness meter (AFT6100M manufactured by NANOMETRIX JAPAN) and the in-plane thickness distribution (film thickness data at the respective measurement points) was obtained. From the in-plane thickness distribution, distribution data, the in-plane thickness uniformity was obtained as follows:

(In-plane Film Thickness Uniformity)=(Maximum Thickness)−(Minimum Thickness)

Next, evaluation was made as follows. By the use of a probe-type step height (thickness) meter, measurement was made of a removal end profile of a removal area (removal end) where the unnecessary resist film in the portion of the edge of the substrate was removed.

Figure 9:
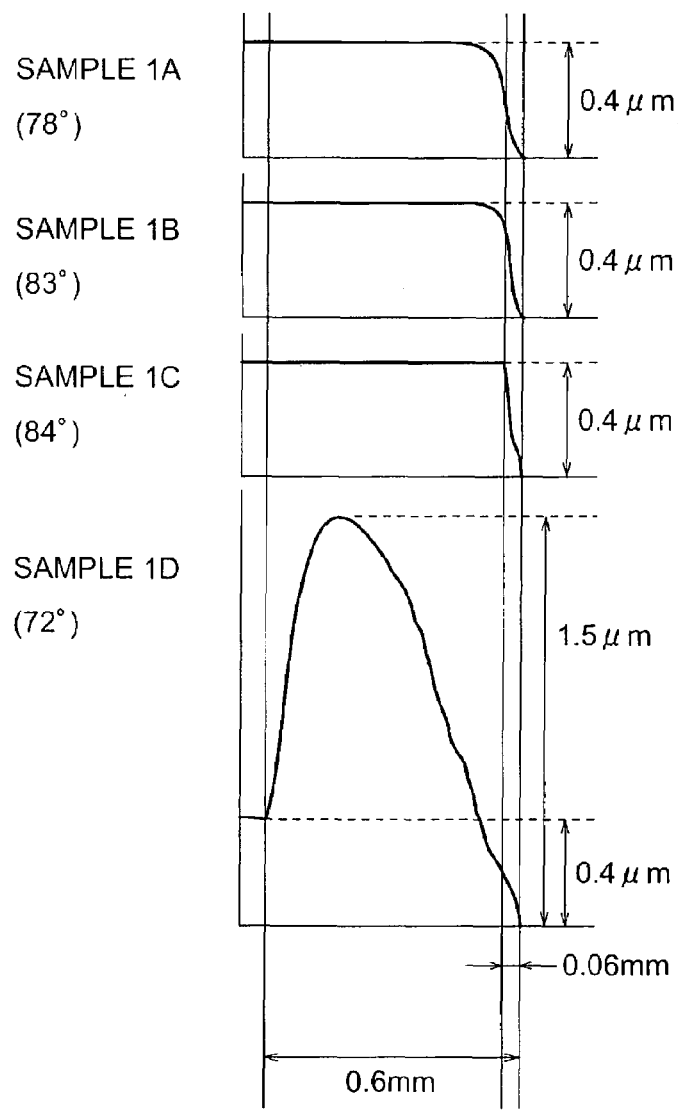
FIG. 9 is a view showing removal end profiles of samples in Example 1.

The removal end profiles in the samples 1A, 1B, 1C, and 1D are illustrated in FIG. 9.

In the sample 1D (removal of the unnecessary resist using the organic solvent: first existing method), a remarkably thick portion having a height of about 1.5 µm was formed at the removal end.

In the sample 1C (removal of the unnecessary resist according to the typical process of treating the chemically-amplified resist (fourth existing method)), such remarkable protrusion at the removal end as seen in the sample 1D was not observed at all and the side wall of the removal area was generally vertical.

In the sample 1B (removal of the unnecessary resist according to the inventive method B), the side wall of the removal area had a shoulder portion (on the side of the upper surface of the resist film) smoothly rounded as compared with the sample 1C. However, the verticality of the side wall of the removal area was generally kept.

In the sample 1A (removal of the unnecessary resist according to the inventive method A), the shoulder portion (on the side of the upper surface of the resist film) of the side wall of the removal area was further smoothly rounded and the verticality of the side wall of the removal area was slightly inferior. However, the remarkable protrusion at the removal end as seen in the sample 1D was not observed and the removal end profile was generally excellent.

In order to numerically compare inclinations of the removal end profiles of the four samples (1A, 1B, 1C, 1D) mentioned above, calculation was made of an angle formed between the straight line passing through two points on the side wall of the removal area and the tangent line on the upper surface of the chromium film (i.e., the bottom surface of the resist). The two points were selected at 50% and 75% of the distance from the bottom surface of the resist film (i.e., the upper surface of the chromium film) to the upper surface of the resist film. The above-mentioned distance corresponds to the thickness (0.4 µm=400 nm) of the resist film. The result is shown in Table 1.

TABLE 1

| Sample | Condition | Degree of Rectangularity |
|---|---|---|
| 1A | application-exposure-development-bake | 78 |
| 1B | application-exposure-bake-development | 83 |
| 1C | application-bake-exposure-PEB-development | 84 |
| 1D | application-removal by solvent-bake | 72 |

In the sample 1D (removal of the unnecessary resist using the organic solvent: first existing method), the angle was 72 degrees. In the sample IC (removal of the unnecessary resist according to the typical process of treating the chemically-amplified resist (fourth existing method)), the angle was 84 degrees. On the other hand, in the sample 1B (removal of the unnecessary resist according to the inventive method B), the angle was 83 degrees substantially equivalent to that of the sample 1C. In the sample 1A (removal of the unnecessary resist according to the inventive method A), the angle was 78 degrees, smaller than that of the sample 1C, but the removal end profile (inclination of the removal end) was not significantly inferior.

For another evaluation, removal width variation at the removal area where the unnecessary resist film in the portion of the edge of the substrate was removed (i.e., variation in distance from the substrate end to the removal end) was measured throughout the whole length of each side. Measurement was carried out by the resist film thickness measurement system (AFT6100M manufactured by NANOMETRICS). The removal width variation was measured for each side of the substrate at intervals of 10 mm. From the measured values, the average value and the range value were calculated. The result is shown in Table 2.

TABLE 2

| Sample | Condition | Uniformity in Removal Width (whole length of each side) | |
|---|---|---|---|
| | | average (mm) | range (mm) |
| 1A | application-exposure-development-bake | 1.90 | 0.10 |
| 1B | application-exposure-bake-development | 2.10 | 0.10 |
| 1C | application-bake-exposure-PEB-development | 2.05 | 0.10 |
| 1D | application-removal by solvent-bake | 1.96 | 0.24 |

In the sample 1D, the average removal width was 1.96 mm and the variation (range value) was 0.24 mm. In the sample 1D, the average removal width was 2.05 mm and the variation (range value) was 0.10 mm.

In the samples 1A and 1B (the removal of the unnecessary resist according to this invention), the average removal width was 1.90 mm and 2.10 mm, respectively. In both of the samples 1A and 1B, the variation (range value) was suppressed to 0.10 mm. Thus, the quality in removal width variation was equivalent to that of the sample 1C.

In the removal of the unnecessary resist according to this invention, it was possible to achieve the quality of removal width variation (in other words, the stability) equivalent to the method of removing the unnecessary resist in the peripheral portion of the substrate according to the typical process (fourth existing method). As compared with the removal of the unnecessary resist in the portion of the edge of the substrate by the use of the organic solvent (first existing method), the removal width variation was remarkably improved (variation was reduced by about 60%).

For next evaluation, measurement was locally made of the removal width variation at the removal area where the unnecessary resist film in the portion of the edge of the substrate was removed (i.e., the variation in distance from the substrate end to the removal end). Measurement was carried out in the following manner. For a local area around the center of one side of the substrate, a photograph of the removal area was taken by an optical microscope (magnification of 100). The photograph was analyzed by the use of the length measuring function of the image processing software (ImageProPlus manufactured by Planetron). Over the range of 1.5 mm long, measurement was made 20 times at intervals of 0.075 mm. Thus, local removal width variation was measured and the average value and the range value were calculated. The result is shown in Table 3.

TABLE 3

| Sample | Condition | Uniformity in Removal Width (local) | |
|---|---|---|---|
| | | sigma (μm) | range (μm) |
| 1A | application-exposure-development-bake | 7.66 | 20.00 |
| 1B | application-exposure-bake-development | 7.75 | 25.00 |
| 1C | application-bake-exposure-PEB-development | 2.26 | 5.00 |
| 1D | application-removal by solvent-bake | 14.01 | 60.00 |

In the sample 1D, the local removal width variation was 60 μm (range value). In the sample 1C, the local removal width variation was 5 μm (range value).

In the samples 1A and 1B (removal of the unnecessary resist according to this invention), the local removal width variations were 20 μm and 25 μm, respectively.

In the removal of the unnecessary resist according to this invention, the local removal width variation (in other words, stability) was not comparable to that obtained by the removal of the unnecessary resist by exposure and development according to the typical process but could be reduced to about ⅓ as compared with the removal by the organic solvent.

From the foregoing results, it is obvious that the method and the apparatus for producing a blank according to this invention as well as the blank produced by the method and the apparatus do not require the step and the apparatus for carrying out the post-exposure bake, requires less exposure energy for exposure, and is not significantly inferior in quality of removal of the unnecessary resist in the portion of the edge of the substrate, as compared with the method and the apparatus for removing the unnecessary resist according to the typical process of treating the chemically-amplified resist (fourth existing method) and the blank produced by the method and the apparatus.

It is also obvious that the method and the apparatus for producing a blank according to this invention and the blank produced by the method and the apparatus are excellent in quality of removal of the unnecessary resist in the portion of the edge of the substrate, as compared with the method and the apparatus for removing the unnecessary resist by the use of the organic solvent (first existing method) and the blank produced by the method and the apparatus.

Example 2

Next, a second example according to the inventive method A and the inventive apparatus A was prepared by the use of a polymer-type positive EB lithography/exposure resist ZEP7000 (manufactured by ZEON CORPORATION).

At first, in the manner similar to the sample 1A in Example 1, the polymer-type positive EB lithography/exposure resist ZEP7000 (manufactured by ZEON CORPORATION) was applied by spin coating to the thickness of 400 nm under the following condition.

| | |
|---|---|
| Resist Concentration: | 4.7% (viscosity: 17 cp) |
| Leveling Step (Uniforming Step) | |
| Principal Rotation Speed: | 1100 rpm |
| Principal Rotation Time: | 10 sec |
| Drying Step: | |
| Dry Rotation Speed: | 250 rpm |
| Dry Rotation Time: | 90 sec |

Subsequently, by the use of the exposure apparatus and the method described above, the substrate was moved at a speed of about 10 mm/sec and the portion of the edge of the substrate was exposed as a selectively exposed area. Thereafter, by the use of the development/removal apparatus and the method described above, the substrate was treated for 60 seconds by the use of a standard developer ZED400 (manufactured by ZEON CORPORATION) at a flow rate of 100 cc/min in the manner such that the developer was selectively supplied to the selectively exposed area. Immediately thereafter, a standard rinse solution ZMD-B (manufactured by ZEON CORPORATION) was supplied instead of the developer to rinse the area subjected to development/removal. Then, the substrate was rotated at 2000 rpm and dried. Thus, removal of the unnecessary resist film in the portion of the edge of the substrate was completed. Finally, the substrate after the above-mentioned steps was subjected to post-application bake for 10 minutes by the use of a hot plate (proximity gap: 0.2 mm) kept at 220° C. Thus, production of the blank was completed (Sample 2A).

Next, an example according to the inventive method B and the inventive apparatus B was prepared. At first, ZEP7000 was applied in the manner similar to the above-mentioned sample 1A. Subsequently, by the use of the exposure apparatus and the method described above, the exposure window was moved by scanning means at a speed of about 10 mm/sec along each side of the peripheral portion of the substrate to expose the portion of the edge of the substrate. Thereafter, the substrate was subjected to post-exposure bake for 10 minutes by the use of a hot plate (proximity gap 0.2 mm) kept at 220° C. Finally, the exposed part was selectively developed and removed in the manner similar to the sample 2A. Thus, removal of the unnecessary resist film in the portion of the edge of the substrate was completed and the blank was produced (Sample 2B).

Next, as a control for comparison, a sample 2C was prepared by exposing and developing the unnecessary resist film in accordance with the typical process of treating the resist (third existing method). At first, ZEP7000 was applied in the manner similar to the above-mentioned sample 2A. Subsequently, post-application bake was carried out for 10 minutes by the use of a hot plate (proximity gap: 0.2 mm) kept at 220° C. in the manner similar to the sample 2A. Thereafter, the exposure window was moved by scanning means at a speed of about 10 mm/sec along each side of the portion of the edge of the substrate to expose the portion of the edge of the substrate. Finally, the exposed part was selectively developed and removed in the manner similar to the samples 2A and 2B. Thus, removal of the unnecessary resist film in the portion of the edge of the substrate was completed and the blank was produced (Sample 2C).

As another control for comparison, a sample 2D was prepared by the removing method using an organic solvent (first existing method). Specifically, ZEP 7000 was applied in the manner similar to the sample 2A. Thereafter, by the use of the apparatus described above and diglyme as the organic solvent, the unnecessary resist film in the portion of the edge of the substrate was dissolved and removed. Then, post-application bake was carried out for 10 minutes by the use of a hot plate (proximity gap: 0.2 mm) kept at 220° C. in the manner similar to the sample 2A (Sample 2D).

In each of the samples 2A to 2D, the in-plane uniformity of the resist film thickness, including the mask patterning area, was as excellent as 50 angstroms or less.

Next, evaluation was carried out in the following manner. At first, a removal end profile of the removal area (removal end) where the unnecessary resist film in the portion of the edge of the substrate was removed was measured by a probe-type step height (thickness) meter.

Figure 10:
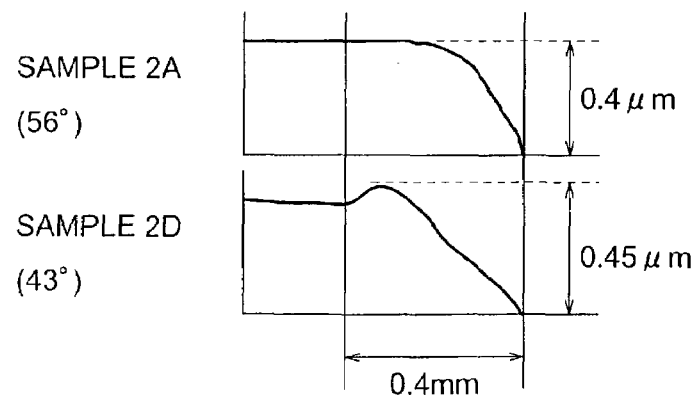
FIG. 10 is a view showing removal end profiles of samples in Example 2.

Referring to FIG. 10, the samples 2A and 2D had the removal end profiles shown in the figure.

In the sample 2D (removal of the unnecessary resist using the organic solvent), a thick portion having a height of about 0.05 μm was formed at the removal end. On the other hand, in the sample 2A (removal of the unnecessary resist according to the inventive method A), such remarkably thick portion as observed in the sample 2D was not formed.

The verticality of the side wall of the removal area was 43 degrees in the sample 2D (removal of the unnecessary resist using the organic solvent) and was 56 degrees in the sample 2A (removal of the unnecessary resist according to the inventive method A). Thus, the side wall of the removal area was steeper in the sample 2A. The foregoing evaluation was carried out in the manner similar to Example 1.

In the meanwhile, in each of the sample 2B (the example according to the inventive method B) and the sample 2C (typical process of treating the resist (third existing method)), the unnecessary resist film in the portion of the edge of the substrate was not removed at all by the exposure/development mentioned above.

Under the circumstances, the exposure amount of the portion of the edge of the substrate by the above-mentioned exposure apparatus was experimentally increased. Specifically, the portion of the edge of the substrate was exposed by moving the exposure window at different speeds gradually lowered from about 10 mm/sec. Thereafter, in the manner similar to the sample 2B or 2C, a combination of the post-application bake and the development/removal or the development/removal alone was carried out.

As a result, it has been revealed that, in both of the samples 2B and 2C, the unnecessary resist film could not be removed in the subsequent development/removal unless the portion of the edge of the substrate was exposed at a speed of about 0.025 mm or less (i.e., at the exposure amount corresponding to 600 times or more as compared with the sample 2A).

From the above-mentioned results, it is obvious that the method and the apparatus for producing a blank according to this invention, in particular, the inventive method A and the inventive apparatus A, as well as the blank produced by the method and the apparatus make it possible to carry out exposure at a less exposure energy. In particular, in removal of the unnecessary resist in the portion of the edge of the substrate in the polymer-type EB lithography/exposure resist having little sensitivity to the far-ultraviolet region, as compared with the method and the apparatus for exposing and developing/removing the unnecessary resist in the portion of the edge of the substrate according to the typical process of treating the resist (third existing method) as well as the blank produced by the method and the apparatus.

In addition, this invention is superior in quality of removal of the unnecessary resist in the portion of the edge of the substrate, as compared with the method and the apparatus for removing the unnecessary resist in the portion of the edge of the substrate by the use of the organic solvent as well as the blank produced by the method and the apparatus (first existing method).

However, as compared with the case of the chemically-amplified positive resist in Example 1, the chemically-amplified resist had a removal end profile superior to that of the polymer-type resist. Therefore, the method and the apparatus of this invention are particularly effective for the chemically-amplified resist.

This invention is not restricted to the embodiments and the examples mentioned above.

For example, in the exposure step and apparatus in the foregoing examples, the mercury lamp having the single light guide was used to expose each single side of the substrate at one time. Alternatively, the single light guide may be branched into two or more portions to expose two or more sides of the substrate at one time. Alternatively, the light guide may be configured into a desired shape in conformity with that of a selectively exposed area of the peripheral portion of the substrate so as to collectively expose the four sides (i.e., the entirety of the portion of the edge of the substrate) at one time.

In case where the thickness of the resist film is relatively widely varied along the side of the portion of the edge of the substrate, the scanning means of the light guide in the foregoing examples may be provided with scanning speed adjusting means.

In the step and the apparatus for carrying out the development/removal in the foregoing examples, use was made of the method and the means for selectively developing/removing the exposed part. Alternatively, the entire surface may be developed as far as the function and the quality of the resist film (unexposed part) on the principal surface of the substrate is not deteriorated.

In the foregoing examples, the spin coating of the resist was immediately followed by the exposure of the portion of the edge of the substrate, which was further followed by the development/removal. Alternatively, after the spin coating of the resist (and before the exposure or before the development), another step or another apparatus, for example, for vacuum dry may be added.

In the foregoing examples, the resist was applied by spin coating. Alternatively, use may be made of any other appropriate technique, such as capillary coating and scan coating.

In the foregoing examples, the resist film in the peripheral portion of the substrate was removed as the unnecessary part or film. However, any other part than the peripheral portion may be selected as an unnecessary part or film to be removed.

In the foregoing examples, the square substrate was processed. However, this invention is applicable to a substrate of any other shape by providing selective exposure means and selective developing/removing means.

In the foregoing examples, the exposure means was moved by the scanning means with respect to the photomask blank (fixed). Alternatively, the scanning means may be connected to the holding means for holding the photomask blank so that the photomask blank is moved with respect to the exposure means (fixed).

In the foregoing examples, the EB lithography/exposure resist is mentioned. Not being restricted thereto, the resist may be a laser lithography/exposure resist. Furthermore, the resist may be of any purpose or any type and may be a resist for any exposure source.

From the foregoing, this invention includes a method of producing a resist-coated substrate, comprising a thin film forming step of forming a thin film on a substrate as an optional step, a resist application step of applying a resist on the substrate, a baking step (post-application bake (pre-bake or soft bake) of heat treating the resist applied on the substrate, and a resist film removing step of selectively (partially) removing the resist film formed on the substrate, wherein:

the resist film is selectively (partially) exposed after the resist application step and before the baking step (post-application bake (pre-bake or soft bake)) so that the difference in solubility or dissolving rate in a developer is obtained between an exposed area and an unexposed area upon development in the resist film removing step.

As described above, according to this invention, the unnecessary film in the portion of the edge of the substrate can be removed by development without carrying out the post-exposure bake which has been believed essential in case of the chemically-amplified resist. In other words, it is unnecessary to include the step or the mechanism for carrying out the post-exposure bake independent of the post-application bake. Therefore, for the application of the chemically-amplified resist, the step or the mechanism for carrying out the post-exposure bake is unnecessary. It is therefore possible to simplify the process steps and the apparatus arrangement and to thereby reduce the production cost.

In the method of this invention, the unnecessary resist film in the portion of the edge of the substrate can practically be removed, even in case of the polymer-type EB lithography/exposure resist having little sensitivity to the deep UV (ultraviolet) region, by selectively exposing the unnecessary resist film by deep UV (ultraviolet) radiation after the resist is applied and before the post-application bake (pre-bake or soft bake) is carried out.

Furthermore, in the method of this invention, the exposure can be carried out with less exposure energy, as compared with the case where the exposure is carried out after the post-application bake, by selectively exposing the unnecessary resist film after the resist (of any type) is applied and before the post-application bake (pre-bake or soft bake) is carried out.

What is claimed is:

1. A method of producing a photomask blank, comprising a thin film forming step of forming, on a rectangular substrate, a thin film for causing an optical change in exposure light, a resist application step of applying a positive resist on said thin film, a baking step of heat treating said resist applied on said thin film to dry said resist applied on said thin film, and a removing step of removing an unnecessary resist film formed in a portion of an edge of said substrate, wherein said removing step is carried out by exposing only the resist film in said portion of the edge of said substrate after said resist application step and before said baking step so that a difference in solubility or dissolving speed in a developer is obtained between an exposed area and an unexposed area and thereafter by selectively supplying said developer to only said exposed area.

2. A method of producing a photomask blank as claimed in claim 1, wherein said removing step by said development is carried out before or after said baking step.

3. A method of producing a photomask blank as claimed in claim 1, wherein said photomask blank is covered at least in its peripheral portion by a cover member with a predetermined distance left between a principal surface of said photomask blank and said cover member, said predetermined distance being selected so that said developer is filled exclusively in a gap defined by said predetermined distance for capillary action when said developer is supplied to said gap, said developer being supplied to said gap defining a developer supply area on said principal surface of said photomask blank so that said resist film formed in said portion of the edge of said substrate is removed.

4. A method of producing a photomask blank, comprising a thin film forming step of forming, on a rectangular substrate, a thin film for causing an optical change in exposure light, a resist application step of applying a positive resist on said thin film, and a baking step of heat treating said resist applied on said thin film to dry said resist applied on said thin film, wherein only the resist film in said portion of the edge of said substrate is exposed after said resist application step and before said baking step so that a difference in solubility or dissolving speed in a developer is obtained between an exposed area and an unexposed area and that, in a developing step during a photomask production process, said resist film in said portion of the edge of said substrate exposed as mentioned above is removed simultaneously with formation of a mask pattern.

5. A method of producing a photomask blank as claimed in claim 1, wherein said resist application step comprises a leveling step of dispensing an amount of a resist solution onto said rectangular substrate and rotating said substrate at a predetermined principal rotation speed for a predetermined principal rotation time mainly to achieve a uniform thickness of said resist, and a drying step of rotating, after said leveling step, said substrate at a predetermined dry rotation speed lower than said principal rotation speed for a predetermined dry rotation time mainly to dry said resist having the uniform thickness.

6. A method of producing a photomask blank as claimed in claim 1, wherein said resist is a chemically-amplified resist.

7. A method of producing a photomask blank as claimed in claim 2, wherein said photomask blank is covered at least in its peripheral portion by a cover member with a predetermined distance left between a principal surface of said photomask blank and said cover member, said predetermined distance being selected so that said developer is filled exclusively in a gap defined by said predetermined distance for capillary action when said developer is supplied to said gap, said developer being supplied to said gap defining a developer supply area on said principal surface of said photomask blank so that said resist film formed in said portion of the edge of said substrate is removed.

8. A method of producing a photomask blank as claimed in claim 2, wherein said resist application step comprises a leveling step of dispensing an amount of a resist solution onto said rectangular substrate and rotating said substrate at a predetermined principal rotation speed for a predetermined principal rotation time mainly to achieve a uniform thickness of said resist, and a drying step of rotating, after said leveling step, said substrate at a predetermined dry rotation speed lower than said principal rotation speed for a predetermined dry rotation time mainly to dry said resist having the uniform thickness.

9. A method of producing a photomask blank as claimed in claim 3, wherein said resist application step comprises a leveling step of dispensing an amount of a resist solution onto said rectangular substrate and rotating said substrate at a predetermined principal rotation speed for a predetermined principal rotation time mainly to achieve a uniform thickness of said resist, and a drying step of rotating, after said leveling step, said substrate at a predetermined dry rotation speed lower than said principal rotation speed for a predetermined dry rotation time mainly to dry said resist having the uniform thickness.

10. A method of producing a photomask blank as claimed in claim 4, wherein said resist application step comprises a leveling step of dispensing an amount of a resist solution onto said rectangular substrate and rotating said substrate at a predetermined principal rotation steed for a predetermined principal rotation time mainly to achieve a uniform thickness of said resist, and a drying step of rotating, after said leveling step, said substrate at a predetermined dry rotation speed lower than said principal rotation speed for a predetermined dry rotation time mainly to dry said resist having the uniform thickness.

11. A method of producing a photomask blank as claimed in claim 7, wherein said resist application step comprises a leveling step of dispensing an amount of a resist solution onto said rectangular substrate and rotating said substrate at a predetermined principal rotation speed for a predetermined principal rotation time mainly to achieve a uniform thickness of said resist, and a drying step of rotating, after said leveling step, said substrate at a predetermined dry rotation speed lower than said principal rotation speed for a predetermined dry rotation time mainly to dry said resist having the uniform thickness.

12. A method of producing a photomask blank as claimed in claim 2, wherein said resist is a chemically-amplified resist.

13. A method of producing a photomask blank as claimed in claim 3, wherein said resist is a chemically-amplified resist.

14. A method of producing a photomask blank as claimed in claim 4, wherein said resist is a chemically-amplified resist.

15. A method of producing a photomask blank as claimed in claim 5, wherein said resist is a chemically-amplified resist.

16. A method of producing a photomask blank as claimed in claim 7, wherein said resist is a chemically-amplified resist.

17. A method of producing a photomask blank as claimed in claim 8, wherein said resist is a chemically-amplified resist.

18. A method of producing a photomask blank as claimed in 9, wherein said resist is a chemically-amplified resist.

19. A method of producing a photomask blank as claimed in claim 10, wherein said resist is a chemically-amplified resist.

20. A method of producing a photomask blank as claimed 11, wherein said resist is a chemically-amplified resist.

* * * * *